United States Patent
Shido et al.

(10) Patent No.: US 10,643,972 B2
(45) Date of Patent: May 5, 2020

(54) LIGHT EMITTING DEVICE HAVING A PLURALITY OF LIGHT EMITTING PARTS WITH BRIGHTNESSES DECREASED IN A DIRECTION

(71) Applicant: KOITO MANUFACTURING CO., LTD., Tokyo (JP)

(72) Inventors: Masaya Shido, Shizuoka (JP); Toru Ito, Shizuoka (JP); Koji Magori, Shizuoka (JP); Yoshiro Ito, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/343,728

(22) Filed: Nov. 4, 2016

(65) Prior Publication Data
US 2017/0133348 A1    May 11, 2017

(30) Foreign Application Priority Data
Nov. 5, 2015    (JP) .................. 2015-217716

(51) Int. Cl.
| | |
|---|---|
| *H01L 51/50* | (2006.01) |
| *H01L 51/52* | (2006.01) |
| *H01L 25/04* | (2014.01) |
| *H01L 27/32* | (2006.01) |
| *F21S 43/145* | (2018.01) |
| *F21S 43/31* | (2018.01) |

(Continued)

(52) U.S. Cl.
CPC .......... *H01L 25/048* (2013.01); *F21S 43/145* (2018.01); *F21S 43/31* (2018.01); *H01L 27/3204* (2013.01); *H01L 27/3239* (2013.01); *H01L 51/5012* (2013.01); *H01L 51/5271* (2013.01); *B60Q 1/0058* (2013.01); *B60Q 1/2607* (2013.01); *F21S 43/14* (2018.01); *H01L 2251/5361* (2013.01)

(58) Field of Classification Search
CPC .......... H01L 25/04; H01L 51/50; H01L 51/52
USPC .................................. 235/454; 315/91, 312
See application file for complete search history.

(56) References Cited

U.S. PATENT DOCUMENTS

| | | |
|---|---|---|
| 2005/0111211 A1 | 5/2005 | Takeuchi |
| 2005/0173700 A1* | 8/2005 | Liao .................. H01L 27/3211 257/40 |

(Continued)

FOREIGN PATENT DOCUMENTS

| | | |
|---|---|---|
| CN | 102121655 A | 7/2011 |
| CN | 104235723 A | 12/2014 |

(Continued)

OTHER PUBLICATIONS

Preliminary Search Report issued in French Application No. 1660620, dated Oct. 30, 2018 (8 pages).

(Continued)

*Primary Examiner* — Sheng-Bai Zhu
(74) *Attorney, Agent, or Firm* — Osha Liang LLP

(57) ABSTRACT

The present disclosure relates to a light emitting device using an organic EL. The light emitting device includes an organic EL panel where a plurality of light emitting parts is arranged toward a predetermined direction. The plurality of light emitting parts is configured such that brightness is decreased gradually toward the predetermined direction.

6 Claims, 12 Drawing Sheets

(51) Int. Cl.
*B60Q 1/26* (2006.01)
*B60Q 1/00* (2006.01)
*F21S 43/14* (2018.01)

(56) References Cited

U.S. PATENT DOCUMENTS

| | | | |
|---|---|---|---|
| 2005/0236970 A1* | 10/2005 | Matsudate | H01L 27/3244 313/500 |
| 2006/0017672 A1* | 1/2006 | Aoki | G09G 3/3233 345/77 |
| 2006/0208669 A1* | 9/2006 | Huynh | H05B 33/0818 315/312 |
| 2007/0210700 A1 | 9/2007 | Kato et al. | |
| 2008/0111493 A1* | 5/2008 | Son | H01L 27/3225 315/169.3 |
| 2010/0123008 A1* | 5/2010 | Lo | H04N 1/02815 235/454 |
| 2011/0149585 A1 | 6/2011 | Dubosc | |
| 2012/0169682 A1* | 7/2012 | Kuhlman | H01L 27/3248 345/205 |
| 2012/0256973 A1* | 10/2012 | Choi | H01L 51/5253 345/690 |
| 2013/0015450 A1* | 1/2013 | Kim | H01L 51/5275 257/59 |
| 2013/0200358 A1* | 8/2013 | Hartmann | H01L 51/5212 257/40 |
| 2013/0306952 A1 | 11/2013 | Yamae | |
| 2014/0070724 A1* | 3/2014 | Gould | F21V 13/02 315/291 |
| 2014/0138645 A1* | 5/2014 | Ryu | H01L 51/5256 257/40 |
| 2014/0153273 A1 | 6/2014 | Tsukamoto | |
| 2014/0376252 A1 | 12/2014 | Ohmi | |
| 2015/0084009 A1* | 3/2015 | You | H01L 27/3246 257/40 |
| 2015/0144902 A1 | 5/2015 | Do et al. | |
| 2015/0357305 A1 | 12/2015 | Kawashima et al. | |
| 2016/0369981 A1* | 12/2016 | Emde | F21S 6/003 |
| 2017/0301874 A1* | 10/2017 | Tadokoro | H05B 33/04 |

FOREIGN PATENT DOCUMENTS

| | | |
|---|---|---|
| JP | H10-288683 A | 10/1998 |
| JP | 2005-183352 A | 7/2005 |
| JP | 2013-157424 A | 8/2013 |
| JP | 2014-110178 A | 6/2014 |
| WO | 2005/034586 A1 | 4/2005 |
| WO | 2012/052886 A2 | 4/2012 |
| WO | 2012/102194 A1 | 8/2012 |
| WO | 2014/109159 A1 | 7/2014 |
| WO | 2015/071454 A1 | 5/2015 |

OTHER PUBLICATIONS

Office Action issued in Chinese Application No. 201610961481.1, dated Jan. 11, 2019 (13 pages).
Office Action issued in Chinese Application No. 201610961481.1, dated Jun. 24, 2019 (13 pages).
Office Action issued in Japanese Application No. 2015-217716, dated Jun. 11, 2019 (9 pages).

* cited by examiner

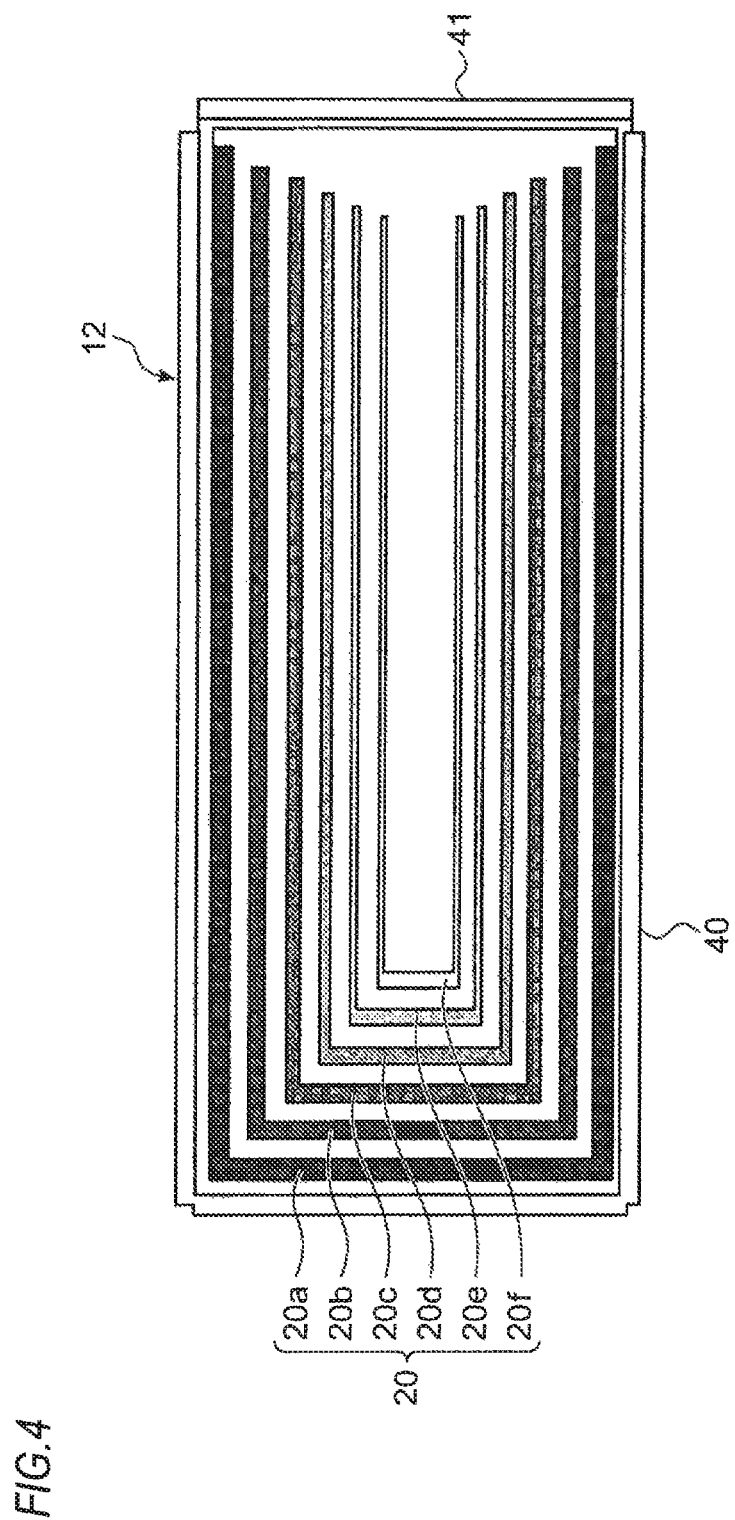

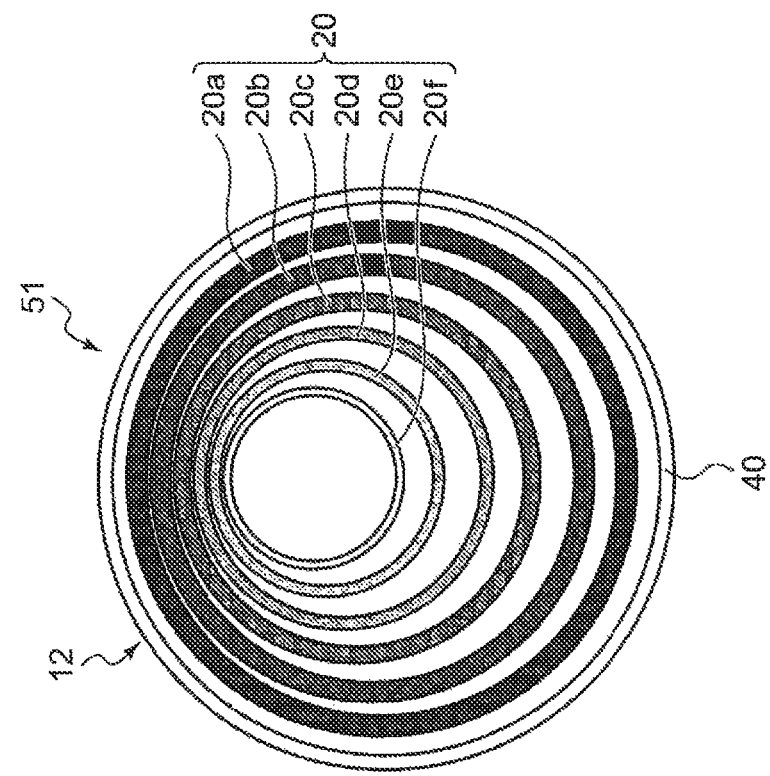
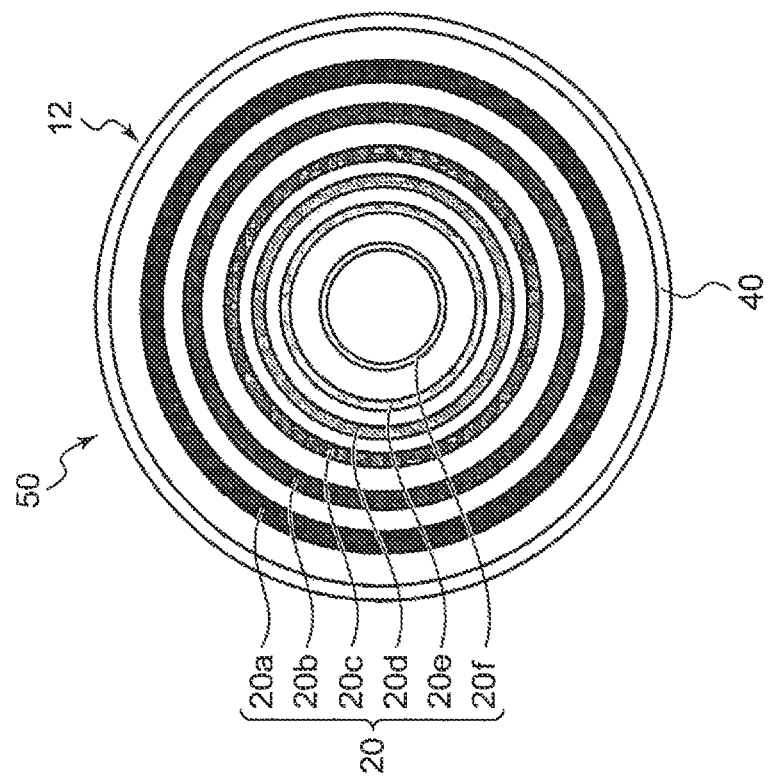

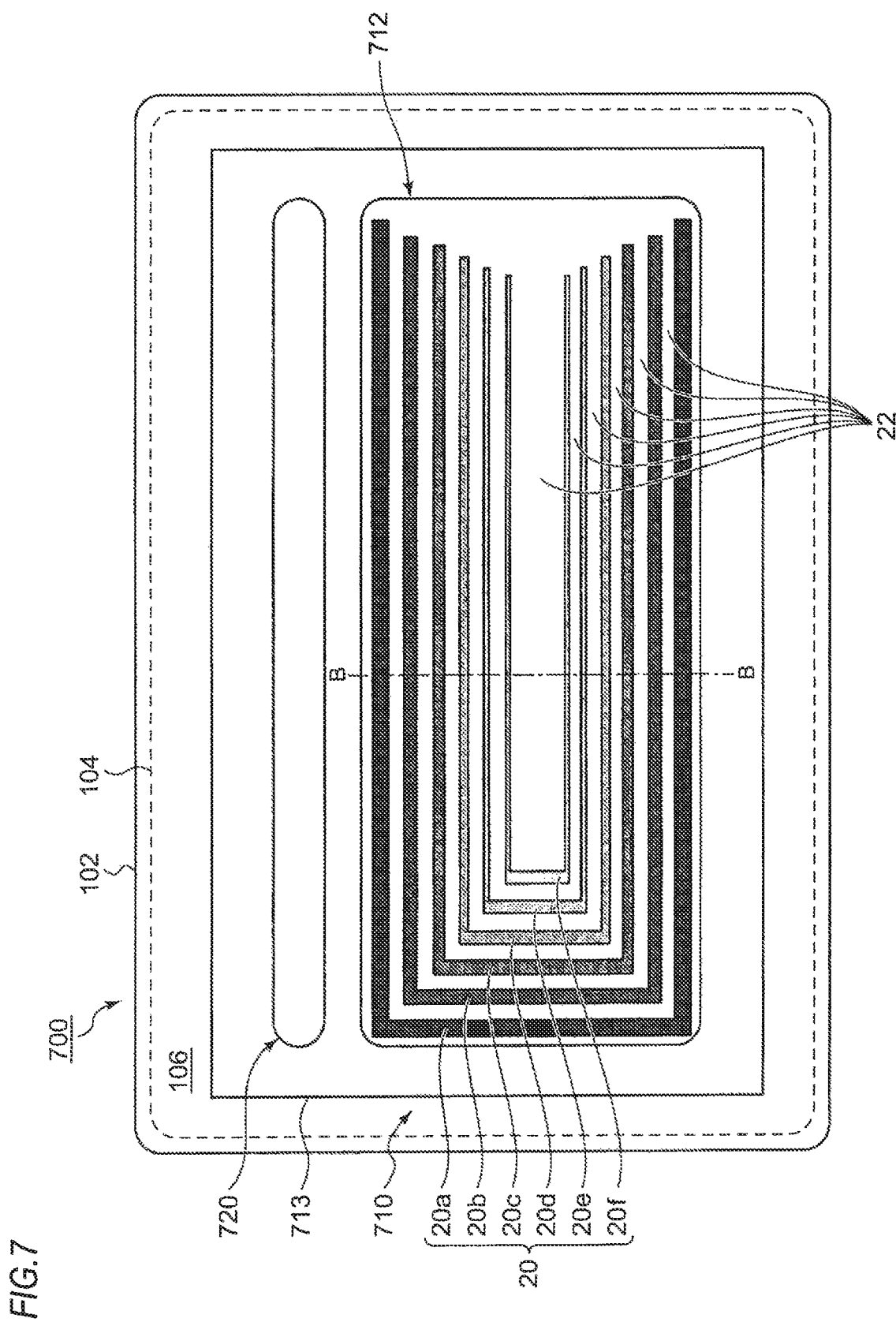

LIGHT EMITTING DEVICE HAVING A PLURALITY OF LIGHT EMITTING PARTS WITH BRIGHTNESSES DECREASED IN A DIRECTION

CROSS-REFERENCE TO RELATED APPLICATION

This application claims priorities from Japanese Patent Application No. 2015-217716 filed on Nov. 5, 2015, the entire contents of which are incorporated herein by reference.

FIELD

The present disclosure relates to a light emitting device using an organic EL (Electro Luminescence).

BACKGROUND

Conventionally, in order to reduce the thickness and size of a light emitting device such as a vehicle lamp, it has been suggested to use an organic EL panel as a light source (e.g., see Patent Document 1).

Patent Document 1: Japanese Patent Laid-Open Publication No. 2014-110178

Since an organic EL panel typically has a planar light emitting surface, a light emitting device using the organic EL panel as a light source tends to have a uniform design.

The present disclosure has been made in consideration of such situations and an object thereof is to improve the design of a light emitting device using an organic EL panel.

SUMMARY

In order to achieve the object, a light emitting device according to one aspect of the present disclosure includes an organic EL panel where a plurality of light emitting parts is arranged toward a predetermined direction. The plurality of light emitting parts is configured such that brightness is decreased gradually toward the predetermined direction.

The plurality of light emitting parts may be configured such that areas are reduced gradually toward the predetermined direction.

The organic EL panel may have a power supply wiring for supplying power to the light emitting parts. The plurality of light emitting parts may be arranged such that distances from the power supply wiring are increased gradually toward the predetermined direction.

A non-light emitting part between the pluralities of light emitting parts may be configured to allow light to be transmitted therethrough. The light emitting device may further include a reflector disposed at a rear of the organic EL panel.

The light emitting device may include a plurality of organic EL panels. The plurality of organic EL panels may be electrically connected in series.

According to the present disclosure, it is possible to improve the design of a light emitting device using an organic EL panel.

BRIEF DESCRIPTION OF DRAWINGS

FIG. 4 is a view for explaining the arrangement of a power supply wiring for supplying power to the light emitting part of an organic EL panel.

FIGS. 5A and 5B are views for explaining a modification of the light emitting device.

FIG. 7 is a schematic front view of a vehicle lamp using a light emitting device according to another embodiment of the present disclosure.

DETAILED DESCRIPTION

Figure 1:
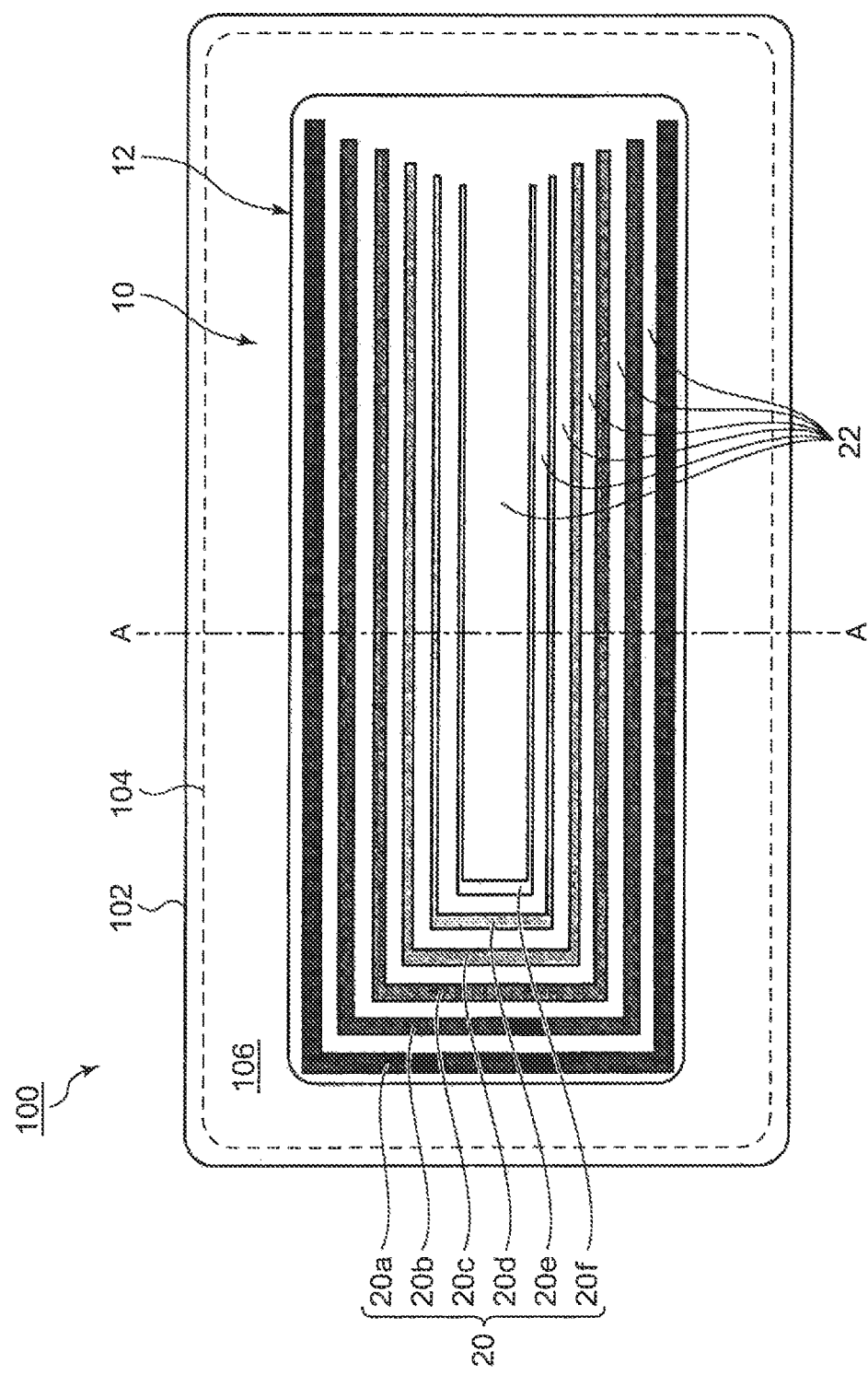
FIG. 1 is a schematic front view of a vehicle lamp using a light emitting device according to an embodiment of the present disclosure.

Hereinafter, a light emitting device according to an embodiment of the present disclosure and a vehicle lamp using the light emitting device will be described in detail with reference to the drawings. Meanwhile, when directional terminology such as "upper," "lower," "front," "rear," "left," "right," "inner" and "outer" is used herein, these terminology refers to directions in a posture when a vehicle lamp is mounted on a vehicle. Further, since respective drawings are intended to illustrate a positional relationship between respective members, respective drawings do not necessarily represent the actual dimensional relationship between respective members. Further, in the description for respective embodiments, the same or corresponding components are denoted by the same reference numerals and a duplicate description thereof is appropriately omitted.

Figure 2:
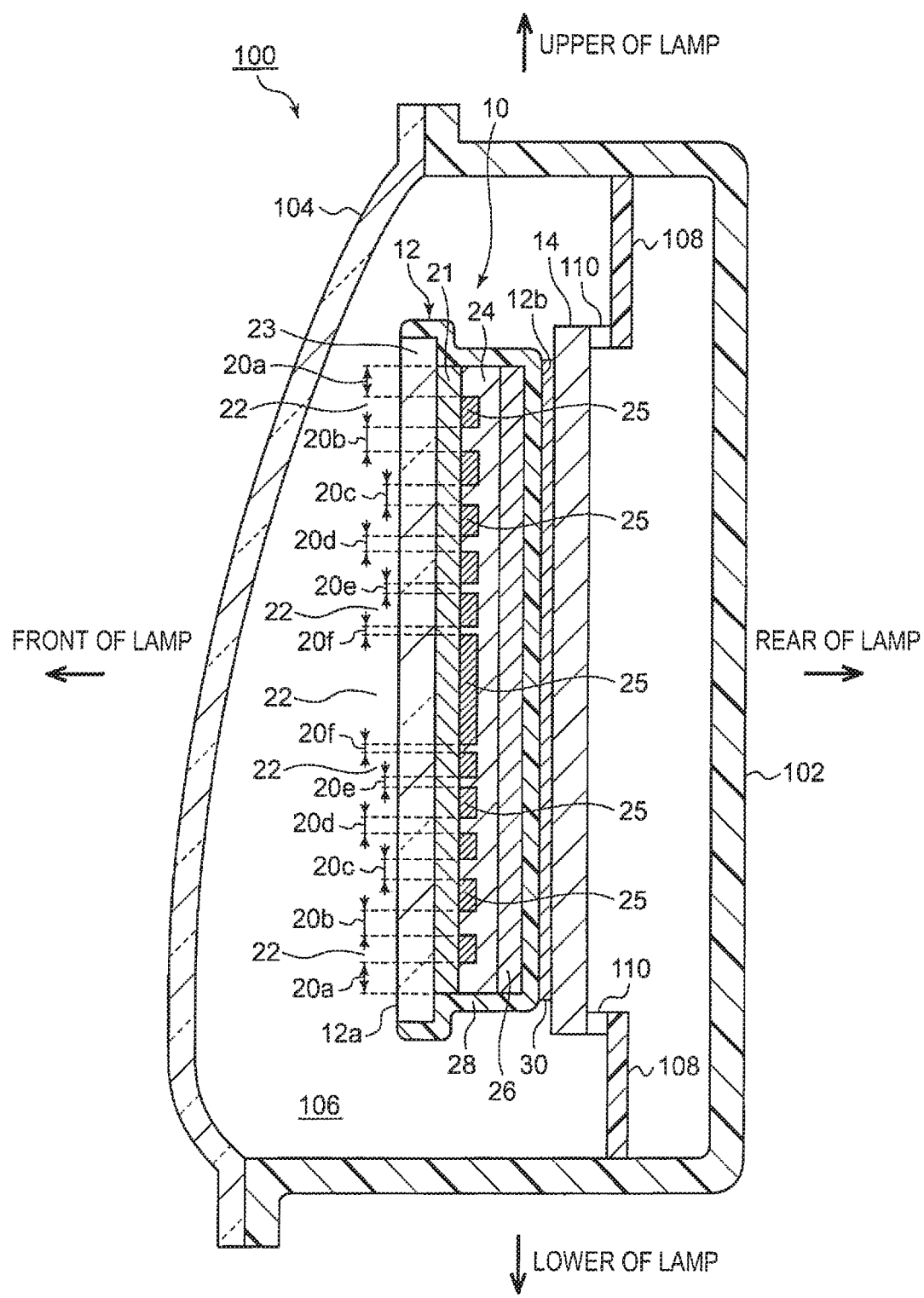
FIG. 2 is a schematic sectional view taken along a line A-A of the vehicle lamp shown in FIG. 1.

FIG. 1 is a schematic front view of a vehicle lamp 100 using a light emitting device 10 according to an embodiment of the present disclosure. FIG. 2 is a schematic sectional view taken along a line A-A of the vehicle lamp 100 shown in FIG. 1. The light emitting device 10 illustrated in FIG. 1 is a tail lamp provided at a rear portion of a vehicle. Meanwhile, the light emitting device 10 may be used in a pilot lamp such as a stop lamp, a daytime running lamp and a clearance lamp.

As shown in FIG. 1, the vehicle lamp 100 includes a lamp body 102, a transparent cover 104 covering a front opening of the lamp body 102, and the light emitting device 10 provided in a lamp chamber 106 which is formed by the lamp body 102 and the cover 104.

The light emitting device 10 includes an organic EL panel 12 and a metal plate 14.

The organic EL panel 12 is configured in such a way that an anode 21, an organic layer 24 and a cathode 26 are laminated on a transparent glass substrate 23 and then sealed by a seal member 28. A transparent electrode such as ITO (Indium Tin Oxide) is used as the anode 21. A metal electrode such as aluminum is used as the cathode 26. When a voltage is applied to the organic layer 24 by using the anode 21 and the cathode 26, positive holes are injected from the anode 21 and electrons are injected from the cathode 26. Further, fluorescent organic compound is excited by energy occurring when the positive holes and the electrons are coupled to each other in the organic layer 24, thereby emitting light. Out of the light emitted in the organic layer 24, the light directed to the anode 21 is emitted to the front of a lamp through the anode 21 and the glass substrate 23. On the other hand, out of the light emitted in the organic layer 24, the light directed to the cathode 26 is reflected in the cathode 26 and then emitted to the front of the lamp through the organic layer 24, the anode 21 and the glass substrate 23. The organic layer 24 may include phosphorescent organic compound. Instead of the glass substrate 23, another transparent substrate such as a resin substrate may be used.

The metal plate 14 is provided on a back surface 12b of the organic EL panel 12. The back surface 12b of the organic EL panel 12 refers to a surface (i.e., surface of the seal member 28) opposite to a light emitting surface 12a of the organic EL panel 12. The metal plate 14 is fixed to the back surface 12b of the organic EL panel 12 by an adhesive 30. The metal plate 14 has a single piece of flat-plate shape and is formed in a size to cover the entire back surface 12b of the organic EL panel 12. The metal plate 14 is not particularly limited as long as it has high thermal conductivity. For example, the metal plate 14 may be made of aluminum or copper. Further, preferably, the metal plate 14 is relatively thick (e.g., 1 mm or more). Heat generated in the organic EL panel 12 is transmitted to the metal plate 14 and diffused in the planar direction of the metal plate 14. As a result, variations in the temperature distribution of the organic EL panel 12 can be reduced.

The organic EL panel 12 is fixed to the lamp body 102 via a bracket 108 as a mounting member. The bracket 108 is provided with a magnetic member 110. The organic EL panel 12 is fixed to the bracket 108 by a magnetic force which is generated between the metal plate 14 and the magnetic member 110. As another method of fixing the metal plate 14 to the bracket 108, there is a method of using a double-sided tape. However, when the double-sided tape is used for fixation, it is difficult to uniformly apply a pressure for bonding. Accordingly, there is a possibility that the organic EL panel 12 is damaged. In this regard, in the fixation method of using the magnetic force as in the present embodiment, it is not necessary to apply a pressure if the organic EL panel 12 and the bracket 108 are precisely aligned. Accordingly, there is little possibility that the organic EL panel 12 is damaged. Further, even when the organic EL panel 12 and the bracket 108 are fixed in a positional offset state, the organic EL panel 12 and the bracket 108 can be detached and the position thereof can be adjusted. Further, the organic EL panel 12 can be easily exchanged in the case of failure. Meanwhile, the organic EL panel 12 may be fixed to the bracket 108 by another fixing means such as an adhesive, a screw and a tape.

As shown in FIG. 1, the organic EL panel 12 of the light emitting device 10 according to the present embodiment includes a plurality of (six) light emitting parts 20 (first light emitting part 20a to sixth light emitting part 20f) separated from each other. Each of the light emitting parts 20 is formed into a U shape, as seen in a front view. The light emitting parts 20 have a substantially similar shape and are formed such that areas of the first light emitting part 20a to the sixth light emitting part 20f are reduced gradually in this order. Specifically, the area of the first light emitting part 20a is largest and the areas of the second light emitting part 20b, the third light emitting part 20c, the fourth light emitting part 20d, the fifth light emitting part 20e and the sixth light emitting part 20f are reduced gradually in this order. The first light emitting part 20a to the sixth light emitting part 20f are arranged in this order toward the center direction of the organic EL panel 12. Specifically, the first light emitting part 20a having the largest area is located on the outermost side, and the second light emitting part 20b, the third light emitting part 20c, the fourth light emitting part 20d, the fifth light emitting part 20e and the sixth light emitting part 20f are arranged in this order on the inner side of the first light emitting part 20a.

In the organic EL panel 12, regions between respective light emitting parts 20 and a region on the inside of the innermost sixth light emitting part 20f are configured as non-light emitting parts 22 which do not emit light In the present embodiment, the non-light emitting parts 22 are formed by providing insulation layers 25 made of an organic material on the corresponding portions of the organic layer 24. Alternatively, the non-light emitting parts 22 may be formed by providing light-shielding films on the corresponding portions of the light emitting surface 12a of the organic EL panel 12.

In the light emitting device 10 configured as described above, light is emitted to the front of a lamp from the light emitting parts 20 when a voltage is applied to the organic layer 24 by using the anode 21 and the cathode 26. Here, in the light emitting device 10 according to the present embodiment, the areas of the light emitting parts 20 are reduced gradually toward the center direction of the organic EL panel 12. Therefore, brightness of the light emitting parts 20 is reduced gradually toward the center direction of the organic EL panel 12. Hunan vision has a characteristic that a bright thing is felt as being close and a dark thing is felt as being far away. Therefore, light emission where the brightness is reduced gradually toward such a predetermined direction can present a sense of depth (three-dimensional appearance) to a viewer, thereby improving the design. In the light emitting device 10 according to the present embodiment, it should be noted that the planar organic EL panel 12 can be used to present a sense of depth. That is, according to the present embodiment, the reduction in thickness of the light emitting device 10 and the presence of the sense of depth can be simultaneously realized.

Figure 3A:
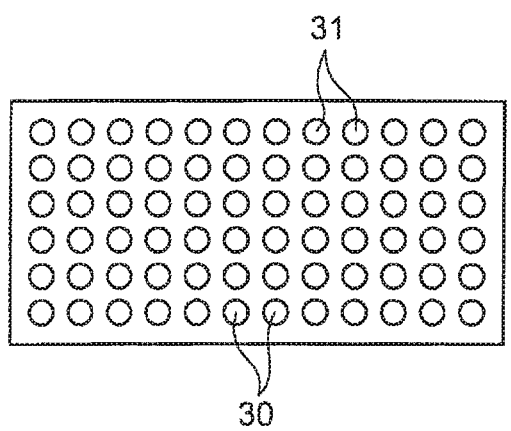
FIGS. 3A and 3B are views showing an example of a pattern to be applied on a light emitting part.
Figure 3B:
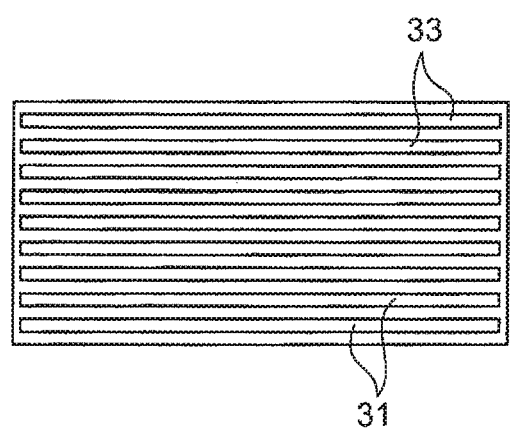

FIGS. 3A and 3B are views showing an example of a pattern to be applied on the light emitting parts. In the light emitting device 10 shown in FIGS. 1 and 2, a pattern of light emitting regions may be formed in the light emitting parts 20 (e.g., the fourth light emitting part 20d, the fifth light emitting part 20e and the sixth light emitting part 20f or the like) disposed inside. FIG. 3A shows a pattern of light emitting regions 31 formed in a dot shape and FIG. 3B shows a pattern of light emitting regions 33 formed in a stripe shape. By changing the ratio of the light emitting regions and the non-light emitting regions therearound, the brightness of the light emitting parts 20 can be regulated. In addition to the adjustment of the areas of the light emitting parts, the above-described patterns are formed. In this way, the brightness can be more effectively reduced toward the center direction of the organic EL panel 12.

FIG. 4 is a view for explaining the arrangement of a power supply wiring for supplying for supplying power to the light emitting parts 20 of the organic EL panel 12. The organic EL panel 12 includes an anode power supply wiring 40 electrically connected to the anode 21 (see FIG. 2) and a cathode power supply wiring 41 electrically connected to the cathode 26 (see FIG. 2). The anode power supply wiring 40 and the cathode power supply wiring 41 are arranged along an outer periphery of the outermost first light emitting part 20a. The anode power supply wiring 40 is disposed on three sides of the four sides of the outer periphery of the first light emitting part 20a and the cathode power supply wiring 41 is disposed on the remaining one side. When the anode power supply wiring 40 and the cathode power supply wiring 41 are disposed in this arrangement, distances from the anode power supply wiring 40 are increased gradually toward the center direction of the organic EL panel 12. As a result, by the voltage drop due to the resistance of the anode 21 that is a transparent electrode, the closer the light emitting parts are located to the center of the organic EL panel 12, the lower the brightness thereof is. In addition to reducing the areas of the light emitting parts 20 gradually toward the center direction of the organic EL panel 12, such arrangement of the electrodes is employed. As a result, the brightness is more effectively reduced toward the center direction of the organic EL panel 12, and hence, it is possible to realize light emission where a sense of depth is further improved.

FIGS. 5A and 5B are views for explaining a modification of the light emitting device.

Similar to the above-described light emitting device 10, the organic EL panel 12 of a light emitting device 50 shown in FIG. 5A also includes a plurality of (six) light emitting parts 20 (first light emitting part 20a to sixth light emitting part 20) separated from each other. In this light emitting device 50, each of the light emitting parts 20 is formed into a circular shape, as seen in a front view. The light emitting parts 20 are formed such that areas of the first light emitting part 20a to the sixth light emitting part 20f are reduced gradually in this order. Specifically, the area of the first light emitting part 20a is largest and the areas of the second light emitting part 20b, the third light emitting part 20c, the fourth light emitting part 20d, the fifth light emitting part 20e and the sixth light emitting part 20f are reduced gradually in this order. As shown in FIG. 5A, the closer the light emitting parts 20 are located to the center, the thinner the widths thereof may be. The first light emitting part 20a to the sixth light emitting part 20f are concentrically arranged toward the center direction of the organic EL panel 12. Specifically, the first light emitting part 20a having the largest area is located on the outermost side, and the second light emitting part 20b, the third light emitting part 20c, the fourth light emitting part 20d, the fifth light emitting part 20e and the sixth light emitting part 20f are concentrically arranged on the inner side of the first light emitting part 20a. Further, the anode power supply wiring 40 is disposed along an outer periphery of the outermost first light emitting part 20a. In the light emitting device 50 shown in FIG. 5A, the areas of the light emitting parts 20 are reduced gradually toward the center direction and the distances from the anode power supply wiring 40 are increased gradually toward the center direction. As a result, the brightness of the light emitting parts can be reduced gradually toward the center direction, thereby presenting a sense of depth to a viewer.

The organic EL panel 12 of a light emitting device 51 shown in FIG. 5B also includes a plurality of (six) light emitting parts 20 (first light emitting part 20a to sixth light emitting part 20f) separated from each other. This light emitting device 51 is different from the light emitting device 50 shown in FIG. 5A in that each light emitting part 20 is arranged eccentrically from the center of the organic EL panel 12. Also in the light emitting device 51 shown in FIG. 5B, the brightness of the light emitting parts 20 can be reduced gradually toward the eccentric direction, thereby presenting a sense of depth to a viewer.

Figure 6A:
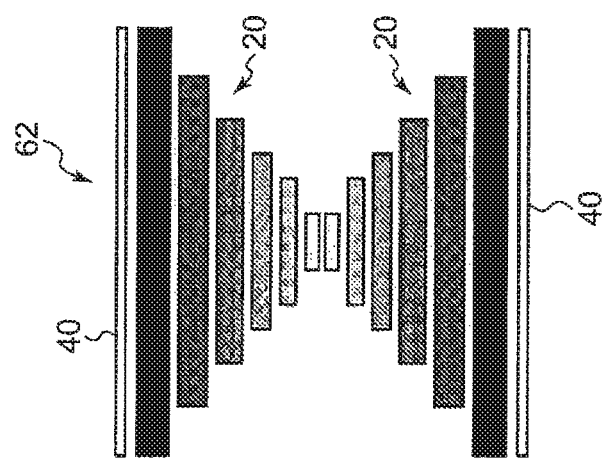
FIGS. 6A to 6C are views for explaining another modification of the light emitting device.
Figure 6B:
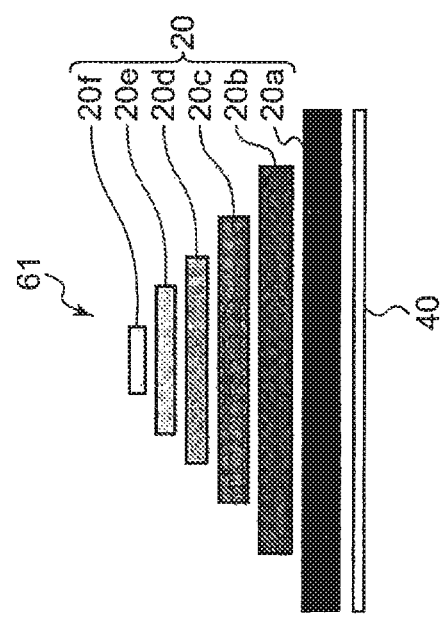
Figure 6C:
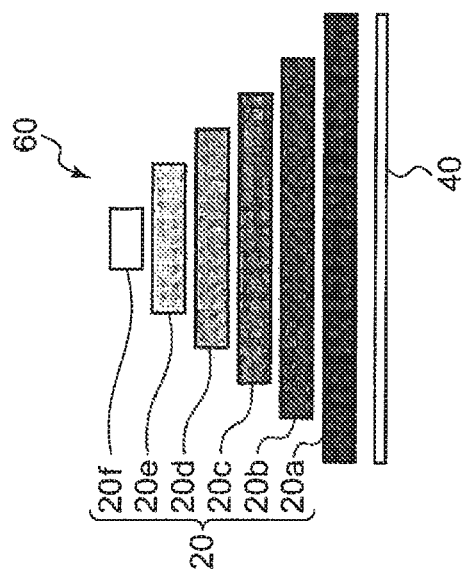

FIGS. 6A to 6C are views for explaining another modification of the light emitting device.

An organic EL panel of a light emitting device 60 shown in FIG. 6A also includes a plurality of (six) light emitting parts 20 (first light emitting part 20a to sixth light emitting part 20f) separated from each other. In this light emitting device 60, each of the light emitting parts 20 is formed into an elongated rectangular shape, as seen in a front view. The light emitting parts 20 are formed such that areas of the first light emitting part 20a to the sixth light emitting part 20f are reduced gradually in this order. Specifically, the area of the first light emitting part 20a is largest and the areas of the second light emitting part 20b, the third light emitting part 20c, the fourth light emitting part 20d, the fifth light emitting part 20e and the sixth light emitting part 20f are reduced gradually in this order. The first light emitting part 20a to the sixth light emitting part 20f are arranged in this order toward the upper direction. Specifically, the first light emitting part 20a having the largest area is disposed on the lowermost side, and the second light emitting part 20b, the third light emitting part 20c, the fourth light emitting part 20d, the fifth light emitting part 20e and the sixth light emitting part 20f are arranged in this order on the upper side of the first light emitting part 20a. Further, the anode power supply wiring 40 is disposed below the lowermost first light emitting part 20a. In the light emitting device 60 shown in FIG. 6A, the areas of the light emitting part 20 are reduced gradually toward the upper direction and the distances from the anode a power supply wiring 40 are increased gradually toward the upper direction. As a result, the brightness of the light emitting parts 20 can be reduced gradually toward the upper direction, thereby presenting a sense of depth to a viewer.

An organic EL panel of a light emitting device 61 shown in FIG. 61B also includes a plurality of (six) light emitting parts 20 (first light emitting part 20a to sixth light emitting part 20f) separated from each other. This light emitting device 61 is different from the light emitting device 60 shown in FIG. 6A in that the light emitting parts are narrow toward the upper direction. Also in the light emitting device 61 shown in FIG. 6B, the brightness of the light emitting parts 20 can be reduced gradually toward the upper direction, thereby presenting a sense of depth to a viewer.

In an organic EL panel of a light emitting device 62 shown in FIG. 6C, the same light emitting parts 20 as those shown in FIG. 6B are vertically symmetrically arranged. Further, anode power supply wirings 40 are disposed on the upper and lower sides. In the fight emitting device 62 shown in FIG. 6C, the brightness of the light emitting parts 20 can be reduced gradually toward the center direction, thereby presenting a sense of depth to a viewer.

Figure 8:
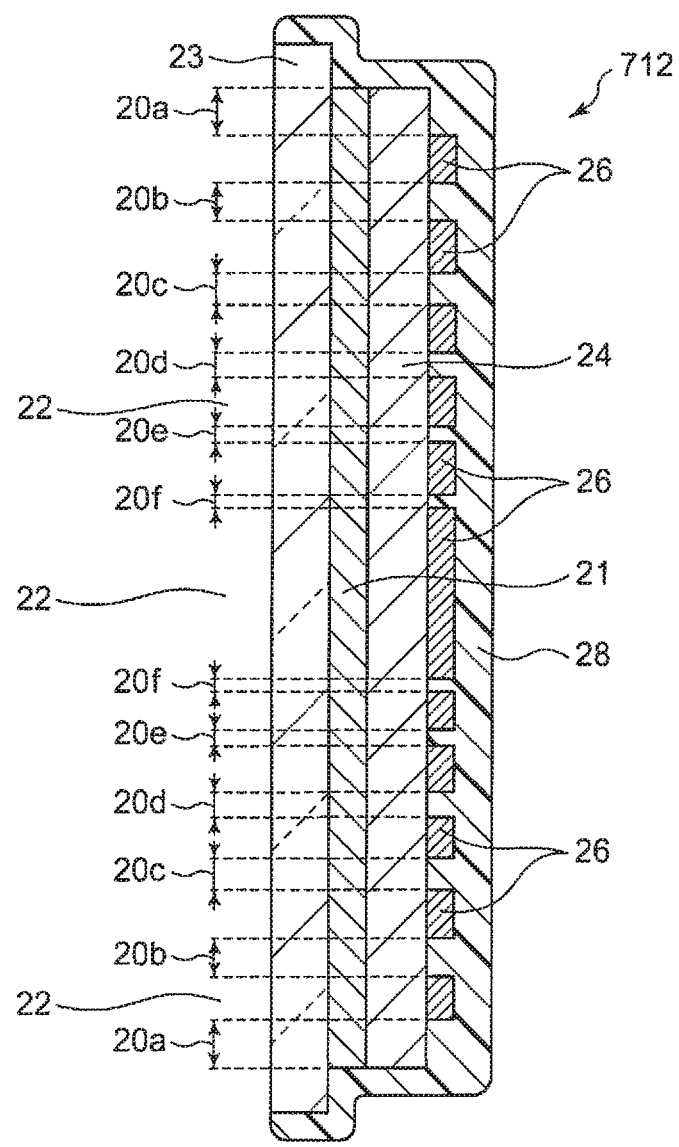
FIG. 8 is a schematic sectional view taken along a line B-B of an organic EL panel shown in FIG. 7.

FIG. 7 is a schematic front view of a vehicle lamp 700 using a light emitting device according to another embodiment of the present disclosure. FIG. 8 is a schematic sectional view taken along a line B-B of the vehicle lamp 700 shown in FIG. 7.

As shown in FIG. 7, the vehicle lamp 700 includes a first light emitting device 710 and a second light emitting device 720, which are provided in a lamp chamber 106 formed by a lamp body 102 and a cover 104. The first light emitting device 710 may be a tail lamp and the second light emitting device 720 may be a stop lamp.

The first light emitting device 710 includes an organic EL panel 712 and a reflector 713.

The organic EL panel 712 is configured in such a way that an anode 21, an organic layer 24 and a cathode 26 are laminated on a transparent glass substrate 23 and then sealed by a transparent seal member 28. A transparent electrode such as ITO (Indium Tin Oxide) is used as the anode 21. A metal electrode such as aluminum is used as the cathode 26.

Similar to the embodiment shown in FIG. 1, the organic EL panel 712 includes a plurality of (six) light emitting parts 20 (first light emitting part 20a to sixth light emitting part 20f) separated from each other. In the present embodiment, the plurality of light emitting parts 20 are formed by a plurality of cathodes 26 separated from each other. The portion of the organic layer 24 on which the cathode 26 is provided is configured as the light emitting part 20 and the portion thereof on which the cathode 26 is not provided is configured as the non-light emitting part 22. In the organic EL panel 712, the non-light emitting part 22 is configured as a transparent part to allow light to be transmitted therethrough.

The reflector 713 is disposed at the rear of the organic EL panel 712. The reflector 713 may be configured by depositing a metal film such as aluminum on a base material. The area of the reflector 713 is preferably greater than that of the organic EL panel 712.

The second light emitting device 720 is disposed above the organic EL panel 712. The position of the second light emitting device 720 in a depth direction is preferably located between the organic EL panel 712 and the reflector 713. The type of the second light emitting device 720 is not particularly limited. For example, the second light emitting device 720 may use an LED or a bulb.

Figure 9:
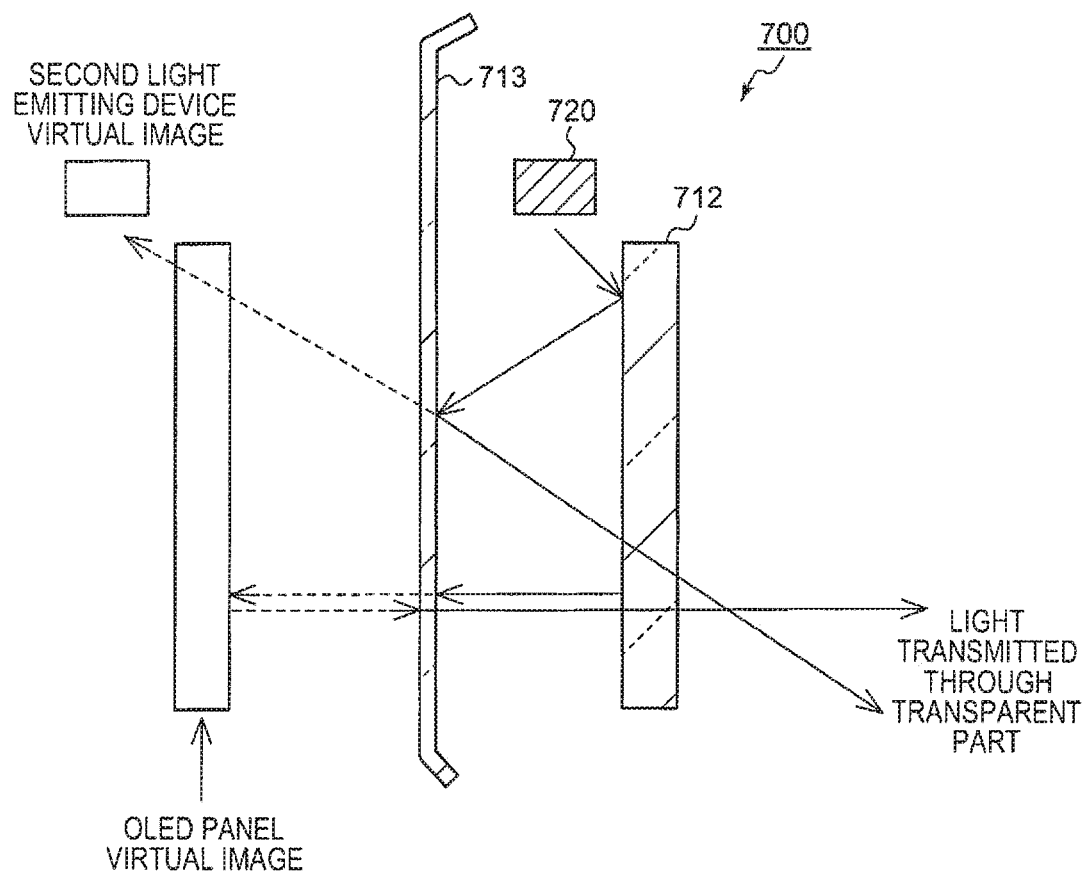
FIG. 9 is a view for explaining a state of light emission of the vehicle lamp according to the present embodiment.

FIG. 9 is a view for explaining an aspect of light emission of the vehicle lamp 700 according to the present embodiment. Also in the present embodiment, the light emission where brightness is reduced gradually toward the center direction of the organic EL panel 712 can present a sense of depth to a viewer. Further, in the present embodiment, the organic EL panel 712 is reflected on the reflector 713 and a visual image thereof is visible from the transparent part of the organic EL panel 712, so that it is possible to present a further sense of depth to a viewer. Furthermore, in the present embodiment, a portion of light emitted from the second light emitting device 720 separate from the organic EL panel 712 is multiply reflected between the cathode 26 of the organic EL panel 712 and the reflector 713. Then, a portion of the light multiply reflected is transmitted through the transparent part (i.e., the non-light emitting part 22) of the organic EL panel 12. In this way, it is possible to present a further sense of depth to a viewer.

Figure 10:
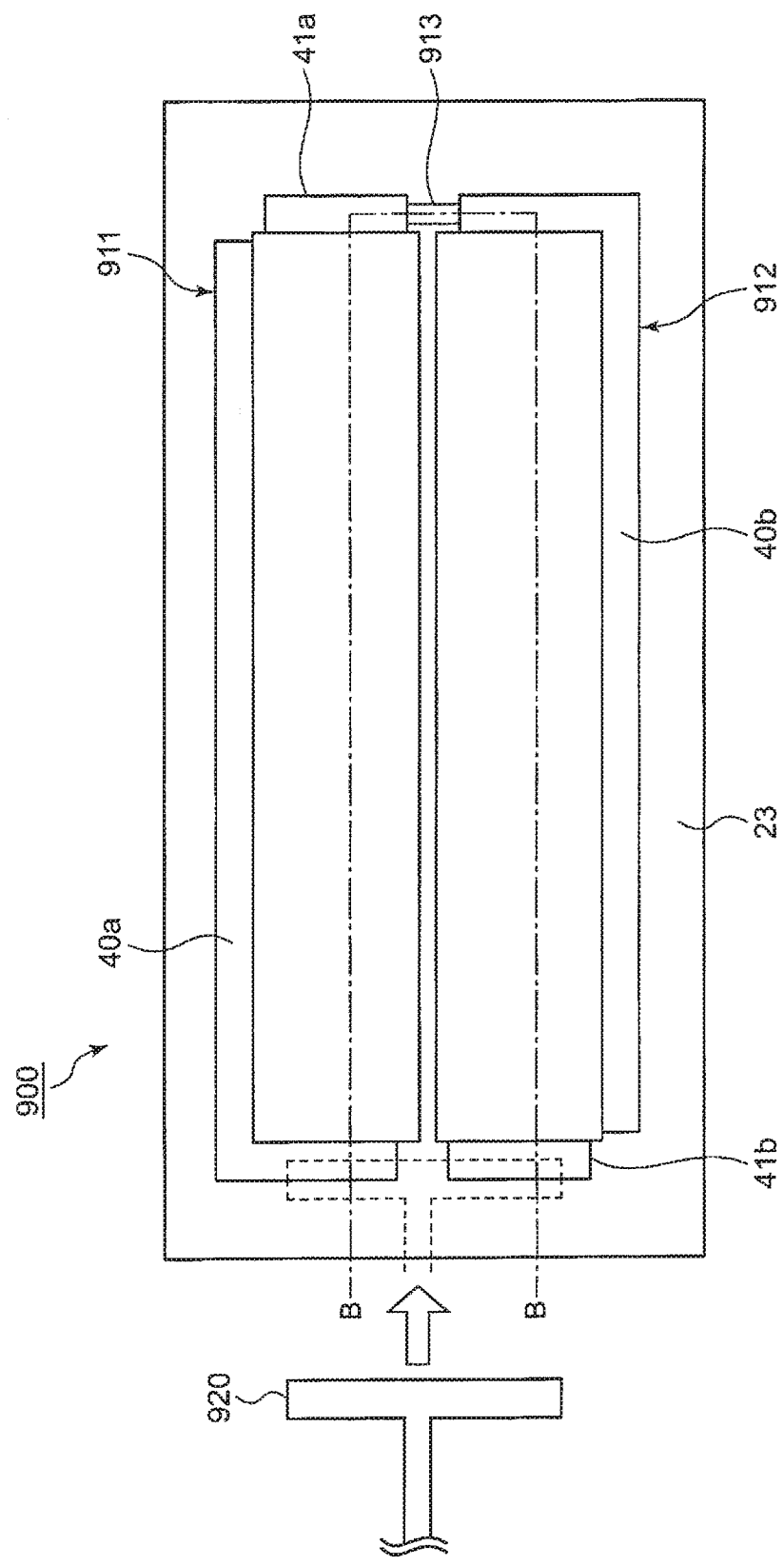
FIG. 10 is a schematic front view for explaining a configuration of a light emitting device according to another embodiment of the present disclosure.
Figure 11:
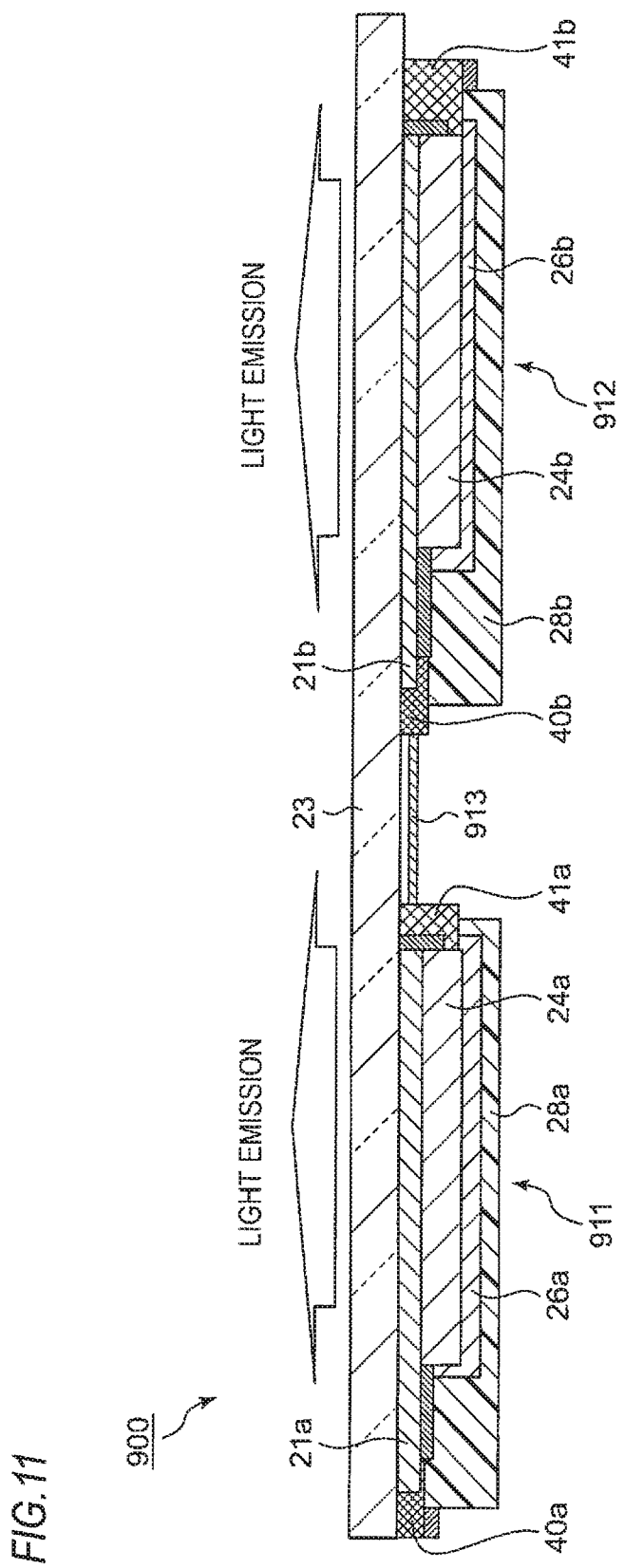
FIG. 11 is a sectional view taken along a line B-B of the light emitting device shown in FIG. 10.

FIG. 10 is a schematic front view for explaining a configuration of a light emitting device 900 according to another embodiment of the present disclosure. FIG. 11 is a sectional view taken along a line B-B of the light emitting device 900 shown in FIG. 10. The light emitting device 900 according to the present embodiment includes two organic EL panels (a first organic EL panel 911 and a second organic EL panel 912).

As shown in FIG. 11, the first organic EL panel 911 is configured in such a way that an anode 21a, an organic layer 24a and a cathode 26a are laminated on a transparent glass substrate 23 and then sealed by a seal member 28a. The first organic EL panel 911 includes an anode power supply wiring 40a electrically connected to the anode 21a and a cathode power supply wiring 41a electrically connected to the cathode 26a. Similarly, the second organic EL panel 912 is configured in such a way that an anode 21b, an organic layer 24b and a cathode 26b are laminated on the transparent glass substrate 23 common to the first organic EL panel 911 and then are sealed by a seal member 28b. The second organic EL panel 912 includes an anode power supply wiring 40b electrically connected to the anode 21b and a cathode power supply wiring 41b electrically connected to the cathode 26b.

Similar to the embodiment shown in FIG. 1, the first organic EL panel 911 and the second organic EL panel 912 may have a plurality of light emitting parts separated from each other, respectively.

The first organic EL panel 911 and the second organic EL panel 912 are adjacently arranged such that a gap therebetween is as narrow as possible. The first organic EL panel 911 and the second organic EL panel 912 are electrically connected in series by a metal wiring 913. Further, as shown in FIG. 10, the anode power supply wirings 40a, 40b and the cathode power supply wirings 41a, 41b are arranged symmetrically with respect to the center of the light emitting device 900.

As shown in FIG. 10, the supply of power to the light emitting device 900 is performed by using a power supply connector 920. The power supply connector 920 may be formed of a flexible printed board. A constant current circuit (not shown) is connected to the power supply connector 920.

The power supply connector 920 is connected to an end of the anode power supply wiring 40a of the first organic EL panel 911 and an end of the cathode power supply wiring 41b of the second organic EL panel 912. The power supply connector 920 and the power supply wirings may be bonded to each other by an anisotropic conductive adhesive. Current supplied from the power supply connector 920 to the anode power supply wiring 40a of the first organic EL panel 911 flows in the anode 21a, the organic layer 24a, the cathode 26a and the cathode power supply wiring 41a of the first organic EL panel 911 and then flows in the metal wire 913. Then, the current flows in the anode power supply wiring 40b, the anode 21b, the organic layer 24b, the cathode 26b and the cathode power supply wiring 41b of the second organic EL panel 912 and then returns to the power supply connector 920.

According to the light emitting device 900 of the present embodiment, the first organic EL panel 911 and the second organic EL panel 912 are electrically connected in series. With this configuration, the output of the constant current circuit for supplying current to the light emitting device 900 can be a single output. Therefore, the circuit scale can be reduced, as compared to the case where the first organic EL panel 911 and the second organic EL panel 912 are connected in parallel. This configuration is advantageous for miniaturization and cost reduction. Further, according to the light emitting device 900 of the present embodiment, a single power supply connector 920 can be used to supply power to two organic EL panels. This configuration is advantageous for miniaturization of the light emitting device 900.

Since the organic EL generally has different rated current depending on the areas, a plurality of organic EL panels with different areas cannot be connected in series. The reason is that the current of the same vale value flows in the plurality of organic EL panels and thus may exceed the rated current when the organic EL panels are connected in series. Therefore, it is preferable that the light emitting areas of the first organic EL panel 911 and the second organic EL panel 912 are the same.

In a vehicle lamp using a plurality of light sources, when any one of the light sources is disconnected, and hence, prescribed light distribution is not satisfied, it is required by law that all the rest of the light sources are turned off. According to the light emitting device 900 of the present embodiment, a plurality of organic EL panels is connected in series, and hence, the law described above is naturally satisfied. Further, it is not required to have a circuit for detecting disconnection, which is advantageous for miniaturization and cost reduction of the light emitting device 900.

Figure 12:
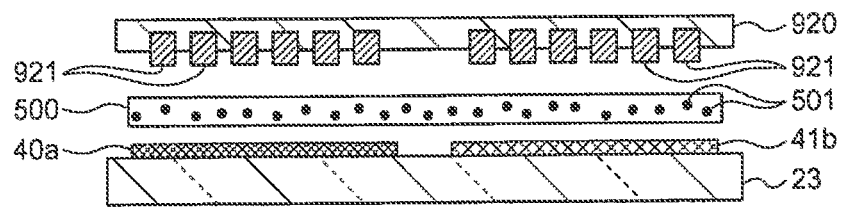
FIG. 12 is a view for explaining connection between a power supply connector and an organic EL panel.

FIG. 12 is a view for explaining the connection between the power supply connector 920 and the organic EL panel. As described above, the power supply connector 920 is connected to the anode power supply wiring 40a and the cathode power supply wiring 41b. The power supply connector 920, the anode power supply wiring 40a and the cathode power supply wiring 41b are bonded to each other by an anisotropic conductive adhesive 500. The anisotropic conductive adhesive 500 contains a plurality of conductive balls 501 therein. When the power supply connector 920 is pressed against the anode power supply wiring 40a and the cathode power supply wiring 41b, the conductive balls 501 are crushed. Then, a terminal 921 of the power supply connector 920 is electrically connected to the anode power supply wiring 40a and the cathode power supply wiring 41b.

Figure 13A:
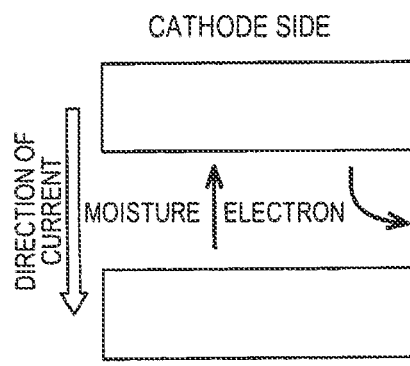
FIGS. 13A and 13B are views for explaining the principle of corrosion which occurs in a connection portion between the power supply connector and an electrode.
Figure 13B:
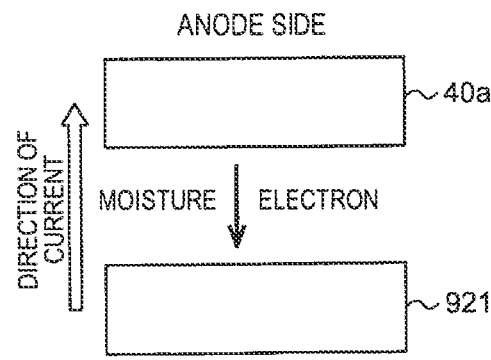

FIGS. 13A and 13B are views for explaining the principle of corrosion which occurs in a connection portion between the power supply connector and the electrode. In the course of performing a high-temperature and high-humidity durability test for the organic EL panel, the present inventors have found that corrosion is liable to occur in the connection portion between the terminal 921 of the power supply connector and the cathode power supply wiring 41b of the organic EL panel. The present inventors have studied the cause of corrosion and have found that the corrosion (i.e., electrolytic corrosion) occurs due to the difference in ionization tendency between Au of the plated terminal 921 and the cathode power supply wiring 41b (Cr or Mo). The ionization tendency is expressed in Cr(−0.744)> Mo(−0.138)≫Au(+1.498). FIG. 13A shows a cathode side. In the cathode side, the direction of current and the direction of ionization current are the same, and hence, the corrosion (i.e., precipitation of Cr or the like) is liable to occur. FIG. 13B shows an anode side. In the anode side, the direction of current and the direction of ionization current are the opposite, and thus, the corrosion is less likely to occur.

Figure 14:
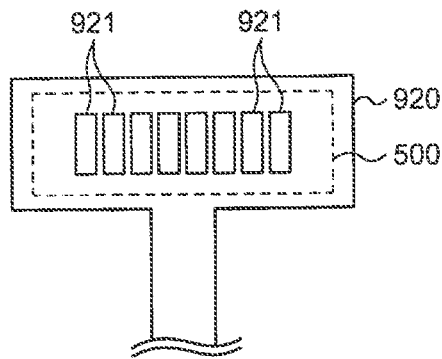
FIG. 14 is a view for explaining a structure which is intended to prevent the occurrence of corrosion in the connection portion between the power supply connector and the electrode.

FIG. 14 is a view for explaining a structure which is intended to prevent the occurrence of corrosion in the connection portion between the power supply connector and the electrode. In this structure, the anisotropic conductive adhesive 500 is disposed so as to cover all of the terminals 921 of the power supply connector 920. As a result, it is possible to prevent moisture from entering between the terminals 921 of the power supply connector 920 and the electrode, thereby suppressing the corrosion. Further, preferably, a moisture-proof coating is applied on the entire connection portion between the power supply connector and the electrode, and thus, moisture is more reliably prevented from entering between the terminals 921 of the power supply connector 920 and the electrode.

In the foregoing, the present disclosure has been described with reference to the embodiments. Those skilled in the art can appreciate that these embodiments are illustrative, combinations of respective components or respective process can be variously modified and such modifications fall within the scope of the present disclosure.

The invention claimed is:

1. A light emitting device comprising: an organic EL panel disposed on a vehicle where a plurality of light emitting parts is arranged toward a predetermined direction approximately perpendicular to a front-back direction of the vehicle, wherein the plurality of light emitting parts are separated by non-light emitting parts, wherein the plurality of light emitting parts is configured such that brightness is decreased gradually toward the predetermined direction, wherein the non-light emitting parts comprise insulation layers embedded on corresponding portions of an organic layer of the organic EL panel, wherein the organic EL panel comprises: an anode, an organic layer, a cathode, an anode power supply wiring electrically connected to the anode, and a cathode power supply wiring electrically connected to the cathode, wherein all of the insulation layers are entirely disposed between the anode and the cathode in a stacking direction of the anode, the organic layer, and the cathode, wherein the anode power supply wiring and the cathode power supply wiring are disposed along an outer periphery of an outermost light emitting part of the plurality of light emitting parts, wherein the anode power supply wiring is disposed on a first part of the outer periphery of the outermost light emitting part, wherein the cathode power supply wiring is disposed on a second part of the outer periphery of the outermost light emitting part where the anode power supply wiring is not disposed, wherein, the anode is a transparent electrode, the anode extends continuously over the plurality of light emitting parts, and the anode of each light emitting part is supplied with power via the anode from the anode power supply wiring on the first part of the outer periphery of the outermost light emitting part, and wherein a resistance of the anode decreases voltage traveling therethrough, such that brightnesses of the plurality of light emitting parts decrease in order in correspondence with an increase in a distance from the anode power supply wiring, wherein the plurality of light emitting parts is configured such that areas of the light emitting parts are reduced gradually toward the predetermined direction.

2. The light emitting device according to claim 1, wherein the organic EL panel has a power supply wiring for supplying power to the light emitting parts, and wherein the plurality of light emitting parts is arranged such that distances from the power supply wiring are increased gradually toward the predetermined direction.

3. The light emitting device according to claim 1, wherein a non-light emitting part between the pluralities of light emitting parts is configured to allow light to be transmitted therethrough, and wherein the light emitting device further comprises a reflector disposed at a rear of the organic EL panel.

4. The light emitting device according to claim 1, wherein the light emitting device comprises a plurality of organic EL panels, and wherein the plurality of organic EL panels is electrically connected in series.

5. A light emitting device comprising: an organic EL panel disposed on a vehicle where a plurality of light emitting parts is arranged toward a predetermined direction approximately perpendicular to a front-back direction of the vehicle, wherein the plurality of light emitting parts are separated by non-light emitting parts, wherein the plurality of light emitting parts is configured such that brightness is decreased gradually toward the predetermined direction, wherein the organic EL panel comprises an anode, an organic layer, and a cathode, wherein the cathode comprises a plurality of cathodes separated from each other and portions of the organic layer on which the plurality of cathodes are disposed are configured as the light emitting parts, wherein the organic layer extends continuously between the light emitting parts and the non-light emitting parts in the predetermined direction, wherein the organic EL panel further comprises: an anode power supply wiring electrically connected to the anode, and a cathode power supply wiring electrically connected to the cathode, wherein the anode power supply wiring and the cathode power supply wiring are disposed along an outer periphery of an outermost light emitting part of the plurality of light emitting parts, wherein the anode power supply wiring is disposed on a first part of the outer periphery of the outermost light emitting part, wherein the cathode power supply wiring is disposed on a second part of the outer periphery of the outermost light emitting part where the anode power supply wiring is not disposed, wherein, the anode is a transparent electrode, the anode extends continuously over the plurality of light emitting parts, and the anode of each light emitting part is supplied with power via the anode from the anode power supply wiring on the first part of the outer periphery of the outermost light emitting part, and wherein a resistance of the anode decreases voltage traveling therethrough, such that brightnesses of the plurality of light emitting parts decrease in order in correspondence with an increase in a distance from the anode power supply wiring, wherein the outer periphery of the outermost light emitting part has first, second, third, and fourth sides, wherein the anode power supply wiring is disposed on the first side, the second side, and the third side of the outer periphery of the outermost light emitting part, wherein the cathode power supply wiring is disposed on the fourth side of the outer periphery of the outermost light emitting part, and wherein distances of the plurality of light emitting parts from the anode power supply wiring are gradually increased toward a direction towards a center of the organic EL panel, and the resistance of the anode decreases the voltage traveling therethrough, such that the brightnesses of the plurality of light emitting parts decrease in correspondence with a decrease in distance from the center of the organic EL panel.

6. The light emitting device according to claim 1,
wherein the outer periphery of the outermost light emitting part has first, second, third, and fourth sides,
wherein the anode power supply wiring is disposed on the first side, the second side, and the third side of the outer periphery of the outermost light emitting part,
wherein the cathode power supply wiring is disposed on the fourth side of the outer periphery of the outermost light emitting part, and
wherein distances of the plurality of light emitting parts from the anode power supply wiring are gradually increased toward a direction towards a center of the organic EL panel, and the resistance of the anode decreases the voltage traveling therethrough, such that the brightnesses of the plurality of light emitting parts decrease in correspondence with a decrease in distance from the center of the organic EL panel.

* * * * *